US005691103A

United States Patent [19]

Takeyama et al.

[11] Patent Number: 5,691,103

[45] Date of Patent: Nov. 25, 1997

[54] IMAGE FORMING MATERIAL, METHOD OF PREPARING THE SAME AND IMAGE FORMING METHOD EMPLOYING THE SAME

[75] Inventors: Toshihisa Takeyama; Ai Katsuda; Kunihiro Koshizuka; Tomonori Kawamura; Masataka Takimoto; Yoshitaka Goto, all of Hino, Japan

[73] Assignee: Konica Corporation, Tokyo, Japan

[21] Appl. No.: 599,186

[22] Filed: Feb. 9, 1996

[30] Foreign Application Priority Data

| | | | |
|---|---|---|---|
| Feb. 17, 1995 | [JP] | Japan | 7-029477 |
| Apr. 6, 1995 | [JP] | Japan | 7-081379 |
| Apr. 11, 1995 | [JP] | Japan | 7-085488 |
| Apr. 28, 1995 | [JP] | Japan | 7-105068 |
| Apr. 28, 1995 | [JP] | Japan | 7-105071 |

[51] Int. Cl.[6] .......... G03C 1/73; G03C 1/805; G03F 7/34

[52] U.S. Cl. .......... 430/200; 430/201; 430/253; 430/964; 430/270.1; 430/273.1; 428/409; 428/143; 428/913; 503/227

[58] Field of Search .......... 430/200, 201, 430/253, 254, 964, 270.1, 273.1; 503/227; 428/409, 913, 143

[56] References Cited

U.S. PATENT DOCUMENTS

| | | | |
|---|---|---|---|
| 3,964,389 | 6/1976 | Peterson | 430/201 |
| 4,711,834 | 12/1987 | Butters et al. | 430/201 |
| 5,278,023 | 1/1994 | Bills et al. | 430/201 |

FOREIGN PATENT DOCUMENTS

| | | |
|---|---|---|
| 0 573 091 A1 | 12/1993 | European Pat. Off. . |
| WO 93/03928 | 3/1993 | WIPO . |
| WO 94/18005 | 8/1994 | WIPO . |

*Primary Examiner*—Richard Schilling
*Attorney, Agent, or Firm*—Frishauf, Holtz, Goodman, Langer & Chick, P.C.

[57] ABSTRACT

An image forming material is disclosed which comprises a support and provided thereon, an image forming layer containing a colorant, the image forming layer being hardened, wherein an image is formed by imagewise exposing the image forming layer to a high density energy light to reduce an adhesive force between the image forming layer and the support and by removing the exposed portions of the image forming layer of the image forming material.

10 Claims, 4 Drawing Sheets

FIG. 6 (c')

IMAGE FORMING MATERIAL, METHOD OF PREPARING THE SAME AND IMAGE FORMING METHOD EMPLOYING THE SAME

FIELD OF THE INVENTION

The present invention relates to an image forming material and an image forming method using the same which gives a high density and a high resolving power, and less image forming layer remained after being exposed to a high density energy light.

BACKGROUND OF THE INVENTION

The recording method is well known which comprises the steps of exposing to a high density energy light such as a laser light, an image forming material, whereby a part of the material is deformed, released, burnt or evaporated and removed (hereinafter referred to as abrasion). This method is a dry process in which a processing solution containing a chemical is not employed, and only the exposed portions are melt-deformed, released or evaporated, which has an advantage resulting in high contrast. This method is used for an optical recording material such as a resist material, an optical disc or an image forming material obtaining a visual image.

Japanese Patent O.P.I. Publication Nos. 59-5447, 59-10563, and 62-115153 disclose a method in which a binder resin is photo-degraded by a pattern exposure to form a resist. Japanese Patent O.P.I. Publication Nos. 55-132536, 57-27788, and 57-103137 disclose a method in which a thin inorganic compound layer provided by evaporation-deposit is exposed to record information by melt-deformation. Japanese Patent O.P.I. Publication Nos. 64-56591, 1-99887, and 6-40163 disclose a method in which a colored binder resin is removed by light heat conversion to record information, and U.S. Pat. No. 4,245,003 disclose an image forming material comprising an image forming layer containing graphite or carbon black.

In Japanese Patent O.P.I. Publication No. 58-18290/1983, PCT Patent No. 4-506709/1992, Japanese Patent O.P.I. Publication No. 6-18290/1994, and U.S. Pat. Nos. 5,156,938, 5,171,650 and 5,256,506 is disclosed an image forming material comprising a light heat converting substance capable of converting absorbed laser light energy to heat energy and a binder capable of being degraded due to heat.

In Japanese Patent O.P.I. Publication No. 58-18290/1983, PCT Patent No. 4-506709/1992, Japanese Patent O.P.I. and U.S. Pat. Nos. 5,156,938, 5,171,650 and 5,256,506 is disclosed an image forming method which receives, on an image receiving sheet, an image forming layer to have been degraded and released.

Further, in Japanese Patent O.P.I. Publication Nos. 4-327982/1992 and 4-327983/1992 is disclosed an image forming method comprising the steps of (a) exposing to a laser light an image forming layer comprising a support and provided thereon, a light heat converting layer, which is also an evaporation layer, containing a light heat converting substance and a colorant layer in that order, whereby the evaporation layer is melted and changes its adhesion to the support, (b) superposing an image receiving layer on the image forming layer, and (c) peeling the image receiving layer from the image forming layer to form an image.

According to these methods, although the problems that the image forming layer, which is exposed and released, pollutes an image forming apparatus is solved, an excellent image is difficult to obtain when an air layer is present, and a high density image without defects is difficult to obtain on the image receiving sheet. On the other hand, when a high density image is formed not on the image receiving layer side but on the image forming material, there has been a problem that exposed portions of the image forming layer is not sufficiently removed, an image with low fog and no image defects is not obtained, and satisfactory resolving power and sensitivity can not be obtained.

SUMMARY OF THE INVENTION

Figure 1:
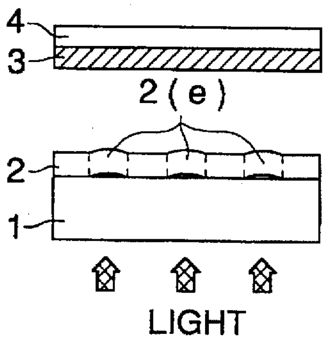
FIGS. 1(*a*), 1(*b*) and 1(*c*) show one of an image forming process in the invention.
Figure 1:
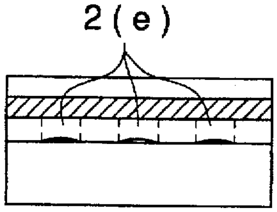
Figure 1:
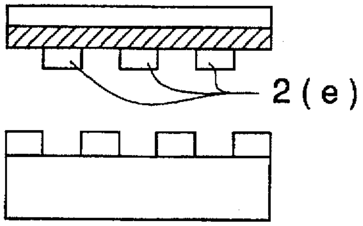

The present invention has been made to overcome the above problems. An object of the invention is to provide an image forming material and an image forming method using the same which gives a high density and a high resolving power, and less image forming layer remained after being exposed to a high density energy light.

DETAILED DESCRIPTION OF THE INVENTION

The above object of the invention can be attained by the following.

1 An image forming material comprising a support and provided thereon, an image forming layer containing a colorant, the image forming layer having been hardened, wherein an image is formed by imagewise exposing the image forming layer to a high density energy light to reduce an adhesive force between the image forming layer and the support and removing the exposed portions of the image forming layer of the image forming material, 2 The image forming material of 1 above, wherein the image forming layer is obtained by coating an image forming layer composition on a support and then hardening the coated composition, 3 The image forming material of 1 above, wherein the image forming layer is obtained by laminating a hardened image forming layer composition on a support, 4 The image forming material of 1 above, wherein the image forming layer is formed by heat hardening an image forming layer containing a heat-hardenable resin, 5 The image forming material of 1 above, wherein the image forming layer is formed by hardening an image forming layer containing a resin capable of being hardened with an active energy ray, 6 The image forming material of 1, 2, 3, 4 or 5 above, wherein the colorant is a light heat converting agent or a visible light absorbing compound having a spectral absorption wavelength of 300 to 800 nm, 7 The image forming material of 6 above, wherein the visible light absorbing compound is a metal atom-containing inorganic compound, 8 The image forming material of 1, 2, 3, 4, 5, 6 or 7 above, wherein a peeling layer is provided on the image forming layer, 9 The image forming material of 8 above, wherein the peeling layer comprises fine particles protruding from the peeling layer surface, and the number of fine particles having the protruding height of 1 to 20 μm is 10 or more per $mm^2$ of the peeling layer, 10 The image forming material of 8 above, wherein the surface roughness $R_a$ of the peeling layer surface facing the image forming layer is 0.04 to 1.0 μm, wherein $R_a$ is measured according to JIS B0601, 11 An image forming method using the image forming material of 1, 2, 3, 4, 5, 6, or 7 above described, the method comprising the steps of a) imagewise exposing the image forming layer of the image forming material to a high density energy light whereby the adhesion force between the support and the exposed portions of the image forming layer is reduced, b) superposing an adhesive layer of an adhesive sheet on the exposed image forming layer, and c) separating the adhesive sheet from the image forming layer to transfer the exposed portions of the image forming layer to the adhesive layer, 12 An image forming method using the image forming material of 8 above comprising the steps of a) imagewise exposing the image forming layer of the image forming material to a high density energy light whereby the adhesion force between the support and the exposed portions of the image forming layer is reduced, and then separating the peeling layer from the image forming layer to transfer the exposed portions of the image forming layer to the peeling layer, removing the exposed portions of the image forming layer to form an image, 13 The image forming method of 11 or 12 above, wherein the imagewise exposing is carried out using a laser light, or 14 The image forming method of 13 above, wherein the laser light has a wavelength of 600 to 1200 nm.

The invention will be explained in detail below.

<Image forming material>

The image forming material of the invention comprises a support and provided thereon, an image forming layer containing a colorant and a binder, the image forming layer being hardened. The image forming layer may be subjected to calender treatment.

The support includes a resin film such as polyacrylate, polymethacrylate, polyethyleneterephthalate, polybutyleneterephthalate, polyethylenenaphthalate, polycarbonate, polyvinyl chloride, polyethylene, polypropylene, polystyrene, nylon, aromatic polyamide, polyether etherketone, polysulfone, polyether sulfone, polyimide or polyether imide, or a film in which the above two or more resin films are laminated.

The support used in the invention is preferably obtained by orienting resins in the film form and heat-setting in view of dimensional stability. In the invention the support is preferably highly transparent, and has a transparency of preferably 50% or more and more preferably 80% or more, since exposure is carried out from the support side when the image forming method as described later is employed. The support may contain a filler such as titanium oxide, zinc oxide, barium sulfate or calcium carbonate, as long as it does not inhibit the effects of the invention.

The thickness of the support in the invention is preferably 10 to 500 μm, and more preferably 25 to 250 μm.

The colorant in the image forming layer can be used without any limitations, so long as they can reduce an adhesion force between the image forming layer and the support in the image forming method described later. In order to effectively reduce the adhesion force and improve image sharpness, a visible light absorbing compound having an absorption in the wavelength of from 300 to 800 nm are preferably used and can be used singly or in combination of two kinds or more. When the visible light absorbing compound can act as a light-heat converting substance later described, the visible light absorbing compound can be used as a colorant.

As the visible light absorbing compound an organic compound and/or inorganic compound can be used. The organic compound includes various dyes or pigments which are well known, and the inorganic compound includes inorganic pigment, metal oxide powder, metal nitride powder, metal carbide powder and metal sulfide powder which are well known. Further, various magnetic powder can be suitably used.

As such a light-heat converting substance, an organic compound and/or an organic compound can be used. The organic compound includes, for example, dyes such as cyanine dyes, rhordanine dyes, oxonol dyes, carbocyanine dyes, dicarbocyanine dyes, tricarbocyanine dyes, tetracarbocyanine dyes, pentacarbocyanine dyes, styryl dyes, pyrilium dyes, phtahlocyanine dyes and metal-containing dyes. Concretely, compounds disclosed in Chem. Rev. 92, 1197 (1992) can be used. The inorganic compound includes graphite, carbon black, tricobalt tetroxide, ferric oxide, chromium oxide, copper oxide and titan black., a metal nitride such as niobium nitride, metal carbide particles such as tantalum carbide, and a metal sulfide. metal powdered particles.

Of the above colorants, when only a visible light absorbing compound acting as a light heat converting substance is used, a non-porous colorant dispersed in the image forming layer is preferable, since the remaining rate of the image forming layer to be removed on exposing to a high density light and forming an image is small, which will be detailed later.

Such a colorant includes an inorganic metal compound having an absorption in the wavelength range of 300 to 800 nm, such as metal oxide powder, metal nitride powder, metal carbide powder and magnetic powder. In order to obtain high resolving power, the grain size of the powders is preferably not more than 0.5 μm, and more preferably not more than 0.30 μm.

For example, when the magnetic powder is used, ferromagnetic ferric oxide powder, ferromagnetic metal powder and cubic, tabular powder are used, and ferromagnetic metal powder is suitably used. which also works as a light heat converting substance is preferably metal atom containing particles in view of its stability, and is preferably metal-containing dyes such as metal phthalocyanines and porphyrins, and inorganic metal particles.

The average major axial length of the ferromagnetic powder is usually not more than 0.30 μm, and preferably not more than 0.20 μm. Employing such a ferromagnetic powder, an image is obtained in which a residual image forming layer is reduced, after the layer is removed in exposing to a high density energy light and the surface property of the image forming layer is improved.

The colorant content of the image forming layer is 10 to 99 weight %, and preferably 30 to 95 weight %.

The first embodiment of the image forming material of the invention comprises a support and provided thereon, an image forming layer containing a colorant, the image forming layer being hardened, wherein the image forming layer is obtained by coating an image forming layer composition on a support and then hardening the coated composition, the image forming layer is obtained by laminating a hardened image forming layer composition on a support, or the image forming layer is obtained by laminating an image forming layer on a support and then hardening the laminated layer.

The hardening in the invention is to make an image forming layer hardener than an image forming layer composition before layer formation, and is carried out according to a conventional method. The hardening is preferably carried out according to heat or irradiation of an active energy ray such as ultraviolet light. The image forming layer for hardening preferably contains a hardening agent according to a binder in the image forming layer.

The heat hardenable resin and optionally added hardening agent include a binder resin having a hydroxy, carboxy or sulfonic acid group and a hardening agent having an isocyanate group, a binder resin having an epoxy group and a hardening agent, a binder resin having an amino group and a hardening agent, and a binder resin having an acid anhydride group and a hardening agent, respectively. The resin capable of being hardened with a catalyst can be also used.

A combination of a binder with a hardening agent or a catalyst includes that of a polyvinyl acetal resin such as polyvinyl butyral, a cellulose resin such as nitrocellulose, polyester or a resin having a hydroxy group such as polyol or vinyl chloride-vinylacetate copolymer with a polyisocyanate such as hexamethyleneisocyanate, triethylenediisocyanate or polymethylenepolyphenylpolyisocyanate, that of an epoxy resin such as bisphenol A type epoxy resin or orthocresolnovolak type epoxy resin with aliphatic or aromatic amines, acid anhydrides or a urea, melamine or phenol resin and that of a diallylphthalate resin with an organic peroxide catalyst.

The content in the image forming layer of the heat hardenable resin is preferably 1–90 weight %, and more preferably 5–70 weight %. The content of the hardening agent or catalyst is preferably 0.1–200 weight parts, and more preferably 0.5–100 weight % based on the 100 weight parts of the heat hardenable resin.

In the active energy ray hardening method, a combination of a conventional compound having an ethylenically unsaturated double bond or an epoxy group with a polymerization initiator can be used.

As a polymerizable compound having an ethylenically unsaturated double bond, a monomer capable of being addition polymerized or crosslink polymerized can be used. The Example includes a monofunctional acrylester such as 2-ethylhexylacrylate, 2-hydroxyethylacrylate or 2-hydroxypropylacrylate or its derivatives, compounds in which the above acrylate is substituted with methacrylate, itaconate, chrotonate or maleate, a bifunctional acrylester such as polyethyleneglycol diacryrate, pentaerythritol diacryrate, bisphenol A diacryrate or diacryrate of a hydroxypyvalic acid neopentyl glycol-ϵ-caprolactam adduct, compounds in which the above diacrylate is substituted with dimethacrylate, diitaconate, dichrotonate or dimaleate, a polyfunctional acrylester such as trimethylolpropane triacrylate, dipentaerythritol pentaacrylate, dipentaerythritol hexaacrylate or pyrogallol triacrylate, compounds in which the above polyacrylate is substituted with polymethacrylate, polyitaconate, polychrotonate or polymaleate.

Further, so-called pre-polymer in which a photohardenable property is given by incorporating acrylic acid or methacrylic acid in an oligomer of moderate molecular weight is suitably used. Besides the above compounds, compounds described on pages 286 to 294 of "11290 Kakaku Shohin", Kagaku kogyo Nippo Co., Ltd. or compounds described on pages 11 to 65 of "UV.EB Hardenable Handbook (Materials)", Kobunshi kanko Kai can be suitably used.

The polymerization initiator includes a benzoin compound such as benzoin or benzoin methylather, a carbonyl compound such as benzophenone or Michler's ketone, an azo compound such as azobisbutyronitrile or azodibenzoyl, a sulfur compound such as dibenzothiazolylsulfide or tetraethylthiuramsulfide, a halogen compound such as carbon tetrabromide or tribromphenylsulfone, a peroxide compound such as di-t-butylperoxide or benzoylperoxide, a metal carbonyl, and a metal complex such as an iron-allene complex disclosed in European Patent Nos. 0,126,712 and 0,157,377. The sensitizer can be optionally added.

As a compound having an epoxy group in its molecule, a conventional epoxy group containing compound capable of being crosslinked can be used without limitations. The example thereof includes a polycondensate of bisphenol A with epichlorhydrin, a polycondensate of hydrogenated bisphenol A with epichlorhydrin, a polycondensate of bisphenol F with epichlorhydrin, glycidyl modified phenol novolak, glycidyl modified o-cresol novolak, an aliphatic glycidyl ether, a polyglycol glycidyl ether, a monoglycidyl ether and a tertiary carboxylic acid monoglycidyl ether. Further, compounds described on pages 778 to 787 of "11290 Kakaku Shohin", Kagaku kogyo Nippo Co., Ltd. can be suitably used.

The polymerization initiator includes a cobalt (III) complex having an amine compound as a ligand which can release the amino compound such as ammonia, ethylene diamine, diethylen triamine or phenylene diamine by irradiation of an active energy ray, and a brönsted acid releasing compound (hereinafter referred to as an acid generating compound). Of these, the acid generating compound is preferable since it can cause continuous chain polymerization of epoxy compound.

The acid generating compound includes 2,4,6-tris (trichloromethyl)-1,3,5-triazine, 2-(4-methoxyphenyl)-4,6-bis(trichloromethyl)-1,3,5-triazine, s-triazine compounds having a trihalomethyl group such as compounds disclosed in Japanese Patent O.P.I. Publication No. 2-306247/1990, an iron complex such as η 6-i-propylbenzene iron hexafluorophosphate or η 5-cyclopentadienyl iron hexafluorophosphate, an onium salt such as diphenyl iodonium hexafluorophosphate, triphenylsulfonium hexafluorophosphate or triphenyltelluronium hexafluoroarsinate, and aryldiazonium salts, diazoketones, o-nitrobenzylesters, sulfonic acid esters, disulfone derivatives, imidosulfonate derivatives or a silanol-aluminum complex disclosed in Japanese Patent O.P.I. Publication No. 62-57646/1987.

The content in the image forming layer of the polymerizable compound is preferably 1–90 weight %, and more preferably 5–70 weight %. The content of the polymerization initiator is preferably 0.1–100 weight parts, and more preferably 0.5–50 weight parts based on the 100 weight parts of the polymerizable compound.

Besides the above components, the image forming layer may contain additives such as a binder resin, lubricants, durability improvers, dispersing agents, anti-static agents, and fillers, as long as the effects of the invention are not inhibited. The binder resin includes vinyl chloride resins such as vinyl chloride-vinyl acetate copolymers, polyolefins such as butadien-acrylonitrile copolymers, polyvinyl acetals such as polyvinyl butyrals, cellulose derivatives including nitrocellulose, styrene resins such as styrene-butadiene copolymers, acryl resins such as acrylate resins, polyamide resins, phenolic resins, epoxy resins, and phenoxy resins.

The lubricants include fatty acids, fatty esters, fatty acide amide, (modified) silicone oils, (modified) silicone resins, fluorinated resins, and fluorinated carbons, and durability improvers include polyisocyanates.

The dispersing agents include fatty acids having 12 to 18 carbon atoms such as lauric acid and stearic acid or their amides, alkali metal salts or alkali earth metal salts, polyalkyleneoxide alkyl phosphates, lecithin, trialkyl polyolefinoxy quartenary ammonium salts and azo compounds having a carboxy group or a sulfon group. The heat hardenable resin, active energy ray hardenable resin or binder resin containing a polar group selected from the group consisting of $—SO_3M$, $—OSO_3M$, —COOM and $—PO(OM_1)_2$ (wherein M represents a hydrogen atom or an alkali atom; and $M_1$ represents a hydrogen atom, an alkali atom or an alkyl group) can be used as dispersing agents.

The antistatic agents include a cationic surfactant, an anionic surfactant, a nonionic surfactant, a polymeric antistatic agent and conductive fine particles and compounds described on pages 875 and 876, 11290 Chemicals, edited by Kagaku Kogyo Nippo Co. Ltd. The fillers include inorganic fillers such as carbon black, graphite, $TiO_2$, barium sulfate, ZnS, $MgCO_3$, $CaCO_3$, ZnO, CaO, $WS_2$, $MoS_2$, MgO, $SnO_2$, $SiO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, tripoli, diatomaceous earth, dolomite, and organic fillers such as polyethylene resin particles, fluorine-containing resin particles, guanamine resin particles, acryl resin particles, silicone resin particles, and melamine resin particles.

The additive content of the image forming layer is preferably 0 to 20 weight %, and more preferably 0 to 15 weight %.

The thickness of the image forming layer is preferably 0.05 to 5.0 μm, and more preferably 0.1 to 3.0 μm. The image forming layer may be a single layer or multiple layers whose compositions may be the same or different. In the multiple layers, the layer closest to a support preferably contains a colorant.

The second embodiment of the image forming material of the invention comprises a support and provided thereon, an image forming layer containing a colorant and a binder having a glass transition temperature Tg of not less than 90° C. or a binder having a heat deformation temperature T of not less than 90° C. which is measured by ASTM648 (t=6.4 mm, 18.6 Kgf, without anneal treatment).

The colorant or other additives in the image forming layer as described in the first embodiment can be also used.

The binder resin includes polymethyl methacrylate (Tg=105° C.), polystyrene (Tg=100° C.), a phenoxy resin (Tg=105° C.), polycarboate (Tg=140°–170° C.), polyarylate (Tg=193° C.), polyether ketone (Tg=143° C.), polysulfone (Tg=190° C.), polyether sulfone (Tg=225° C.), styrene-acrylonitrile copolymer (Tg=93°–95° C.), acrylonitrile acrylic styrene resin (Tg=90° C.), styrene-ethylenepropylene rubber-acrylonitrile copolymer (Tg=92° C.), and polyphenylene sulfide (Tg>95° C.).

The colorant content of the image forming layer is preferably 10 to 99 weight %, and more preferably 30 to 95 weight %, and the binder resin content of the image forming layer is preferably 1 to 90 weight %, and more preferably 5 to 70 weight %. The thickness of the image forming layer in the second embodiment is preferably 0.1 to 10 μm, and more preferably 0.5 to 5.0 μm.

The third embodiment of the image forming material of the invention is an image forming material in which the surface of the image forming layer is subjected to calender treatment. The colorant in the image forming layer as described in the first or second embodiment can be also used. Other components can be used as long as the object of the invention can be attained. The calender treatment is preferably carried out, since the adhesion force between the support and the image forming layer is effectively reduced as described later. In order to lower void in the image forming layer effectively, a nip pressure of 10 to 500 kg/cm, preferably 50 to 300 kg/cm is applied to the image forming layer.

As long as the effect of the invention is not inhibited, the support may be modified according to a conventional surface improving technique such as corona discharge or anchor coating in order to improve an adhesion between a support and an image forming layer or coatability of the image forming layer, or a backing layer may be provided on a support opposite the image forming layer to prevent static charge, improve transportability or prevent plural paper feeding.

The thickness of the anchor coat layer or the backing layer is preferably 0.001 to 10 μm, and more preferably 0.005 to 5 μm.

As a peeling layer, which is provided on a support to transfer an image by imagewise exposing and peeling in the image forming method described later, a self-supportable resin or the above described resin film used for a support may be used.

The peeling layer may be also an adhesive layer provided on the resin film on the image forming layer side.

In order to reduce an adhesion force between an image forming layer and a support by imagewise exposure of a high density energy light to form an image, some voids are preferably provided between the image forming layer and a peeling layer, whereby deformation of the layers easily occurs and a sharp image with reduced staining at exposed portions is obtained.

The first embodiment of the peeling layer in the invention contains fine particles wherein some particles protrude from the peeling layer and the layer has ten or more particles per 1 $mm^2$ which have a protrusion height of 1 to 20 μm. The peeling layer contains the above described low softening point resins.

Figure 4:
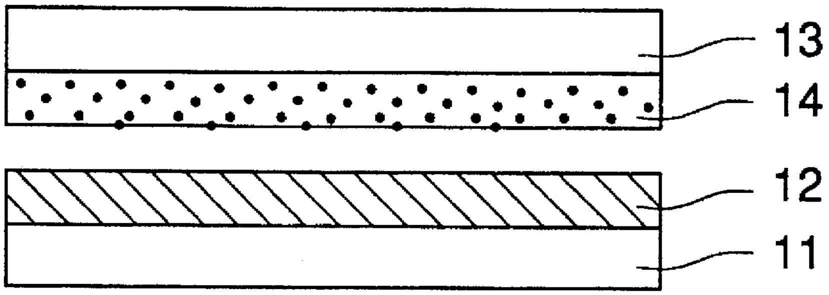
FIG. 4(*a*), 4(*b*) or 4(*c*) shows a preferable embodiment of the image forming material of the invention.
Figure 4:
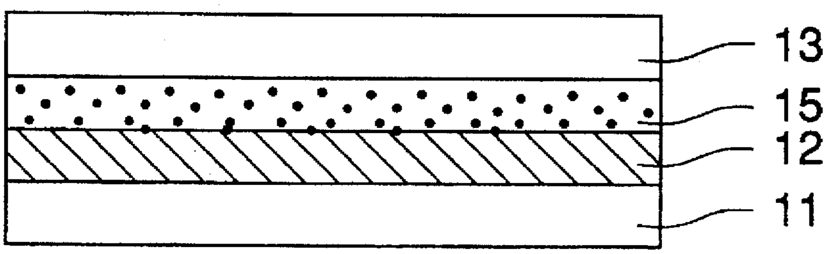
Figure 4:
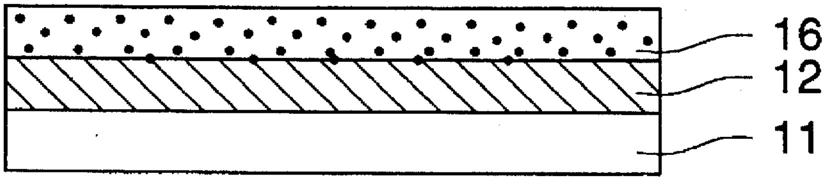
Figure 5:
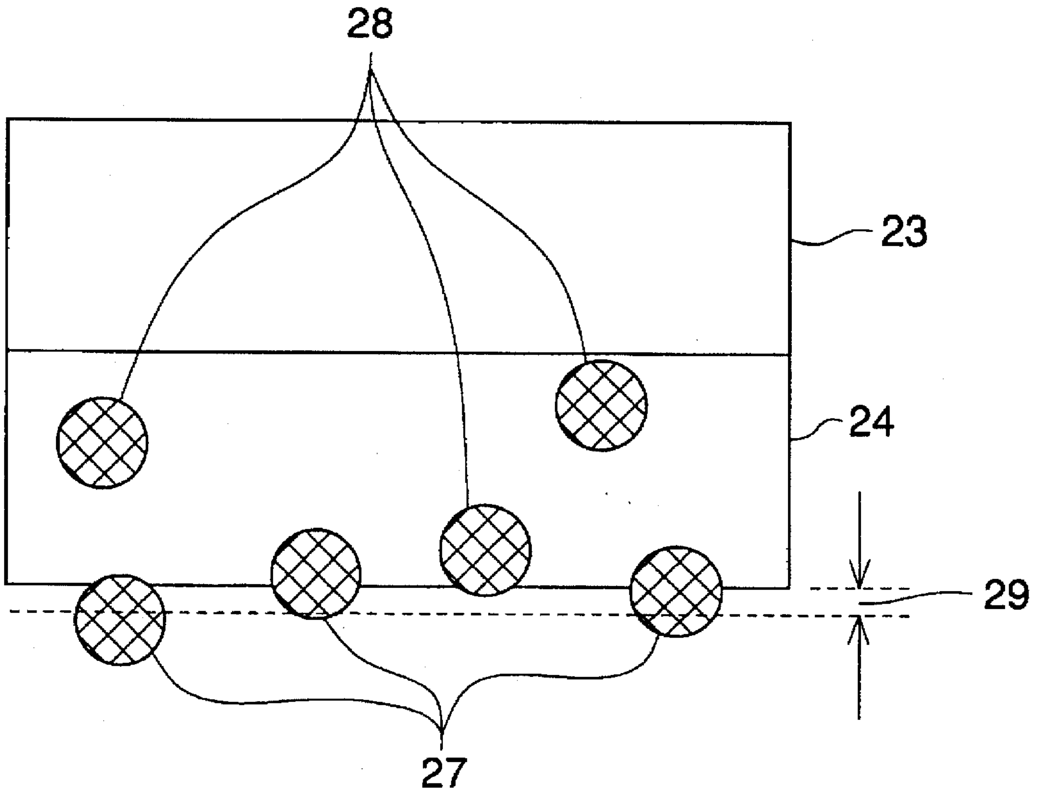
FIG. 5 shows a sectional view of one embodiment of the peeling layer of the invention.

FIG. 4(*a*), 4(*b*) or 4(*c*) is a preferable embodiment of the image forming material of the invention. FIG. 4(*a*) shows a peeling layer 14 containing fine particles provided on a support 13 and an image forming material adjacent to the peeling layer, the image forming material having an image forming layer 12 provided on a support 11. FIG. 4(*b*) shows a peeling layer 15 consisting of polyolefin provided on a support 13 and an image forming material adjacent to the peeling layer, the image forming material having an image forming layer 12 provided on a support 11. FIG. 4(*c*) shows a peeling layer 16 consisting of a self-supporting film, which is extruded and oriented, provided on an image forming layer 12 which is provided on a support 11. FIG. 5 shows a sectional view of one embodiment of the peeling layer of the invention. In this peeling layer fine particle containing layer 24 is provided on a support 23, and some particles protrude from the surface. The numeral 29 represents a height of 1 μm, and particles 27 exceed a height of 1 μm and particles 28 fall within a height of 1 μm or buried in the peeling layer 24. It is important in the peeling layer of the invention that the protruded particles 27 meet the above described conditions.

The fine particles, which are added to the peeling layer, may be any particles as long as the above described condition are satisfied, and for example, the above described fillers used in the image forming layer may be used.

The fine particles having an average particle size of not more than 1 μm can not satisfy the above condition.

When the thickness of the peeling layer is more than the average particle size of the fine particles, some fine particles fall outside the above described range, but if the number of the fine particles satisfying the above condition is 10 or more per $mm^2$, it is within the scope of the invention. The addition amount of fine particles is usually 5 $mg/m^2$ to 10 $g/m^2$.

Figure 6:
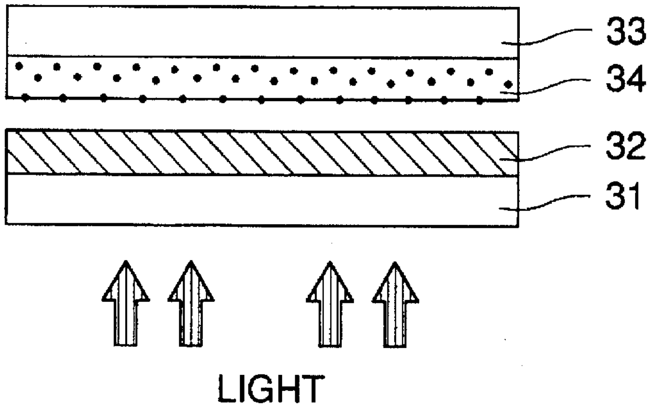
FIGS. 6(*a*), 6(*b*), 6(*c'*) and 6(*c*) show another one of an image forming process in the invention.
Figure 6:
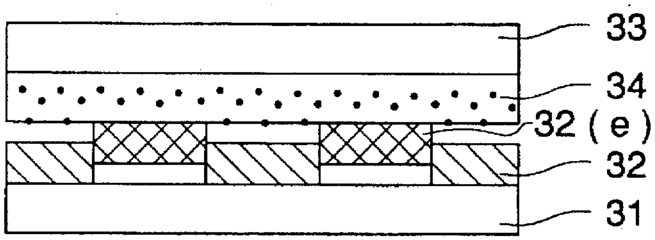
Figure 6:
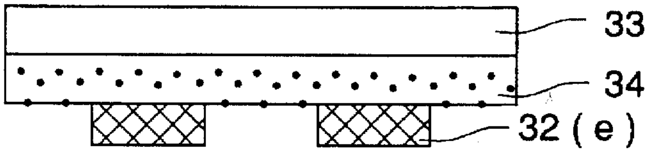
Figure 6:
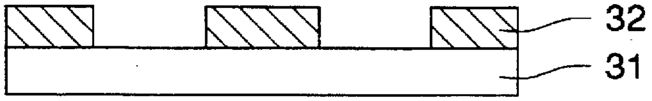

The use of the peeling layer will be explained below using FIGS. 6(*a*), 6(*b*), 6(*c'*) and 6(*c*). The image forming material comprising an image forming layer 32 on a support 31 is superposed on a peeling layer 34 containing fine particles provided on a support 33 as shown in FIG. 6(*a*). The resulting material is imagewise exposed to light from the support 31 side, and the exposed image forming layer 32(*e*) is abraded to form an image as shown in FIG. 6(*b*). The exposed portions 32(*e*) are transferred to the peeling layer side (see FIG. 6(*c'*)), and the peeling layer 34 is peeled from the image forming layer to form an image (see FIG. 6(*c*)).

As a second embodiment of the peeling layer in the invention the surface of the peeling layer on the image forming layer side has a surface roughness $R_a$ of 1.0 to 0.04 μm.

The surface roughness $R_a$ is measured according to JIS B0601. In order to obtain such a surface roughness, fillers are contained or foamed in the presence of a foaming agent in the peeling layer surface contacting an image forming layer. Further, the peeling surface may be subjected to surface treatment such as sand blasting treatment or embossing treatment.

Before an adhesion layer is provided by extrusion-laminating an olefin resin such as polypropylene on a resin film, the surface of the resin film is preferably subjected to primer treatment.

The primer includes titanium alkoxide, zirconium alkoxide, a metal alkoxide, ethylene-vinyl acetate copolymer, poly vinylidene chloride, an olefin resin such as polybutadiene, a urethane resin, an epoxy resin, a polyester resin, an acryl resin, and a polyethylene imine resin. The primer further includes the above described resin hardened by a hardening agent such as an isocyanate compound, an amine compound or an acid anhydride or by irradiation of an electron ray such as ultraviolet light. The compound described in Chapter 33 to 36, "Sin Ramineto Kako Ichiran" edited by Kakogijutu Kyokai is suitably used as the primer.

A method providing a primer layer includes a solution coating method coating and drying a primer solution or a melt coating method coating a primer layer composition in a melting state. A solvent using in the solution coating includes water, alcohols, cellosolves, aromatic organic solvents, ketones, esters, ethers and chlorinated solvents. The coating is carried out by a gravure roller method, an extrusion method, a wire-bar method and a roller method as conventionally used.

The thickness of the primer layer is usually 0.001 to 2.0 μm, and preferably 0.01 to 1.0 μm.

The thickness of the peeling layer is usually 5 to 300 μm, and preferably 10 to 100 μm. When an adhesive layer is provided, the peeling layer thickness is usually 0.1 to 40 μm, and preferably 0.3 to 30 μm.

The adhesive layer may be a layer itself having adhesion property, or a layer producing adhesion property by applied heat or pressure, and can be formed using, for example, a low softening point resin, an adhesive or a heat solvent.

The low softening point resin includes an ethylene copolymer such as ethylene-vinylacetate copolymer or ethylene-ethylacrylate copolymer, a polystyrene resin such as styrene-butadiene copolymer, styrene-isoprene copolymer, or styrene-ethylene-butylene copolymer, a polyester resin, a polyurethane resin, a polyolefin resin such as polyethylene or polypropylene, a polyvinyl ether resin, a polyacrylate resin such as polybutylmethacrylate, an ionomer resin, a cellulose, an epoxy resin, a polyvinyl chloride resin such as copolyvinylchloride-vinylacetate, polyvinyl alcohol and a polyvinyl alcohol derivative such as polyvinyl butyral. The adhesive includes modified or non-modified rosins such as rosin, hydrogenated rosin, rosin-maleic acid, polymeric rosin and rosin phenol, and terpenes and petroleum resins or their modified resins. The heat solvent includes compounds which are solid at ordinary temperature and thermally reversibly liquefies or softens, concretely, monomolecular compounds such as terpineol, menthol, acetoamide, benzamide, cumarine, benzyl cinnamate, diphenylether, crown ether, camphor, p-methylacetophenone, vanillin, dimethoxybenzaldehyde, p-benzyldiphenyl, stilbene, margaric acid, eicosanol, cetylpalmitate, stearic amide, and behenylamine, waxes such as bees wax, candelilla wax, paraffin wax, ester wax, montan wax, carnauba wax, amide wax, polyethylene wax and microcrystalline wax, rosin derivatives such as ester gum, rosin-maleic acid resins and rosin phenol resins, a phenol resin, a ketone resin, an epoxy resin, a diallylphthalate resin, a terpene type hydrocarbon resin, a cyclopentadiene resin, a polyolefin resin, a polycaprolactam resin, and polyethylene oxides such as polyethylene glycol and polypropylene glycol.

The thickness of the peeling layer is usually 5 to 300 μm, and preferably 10 to 100 μm. When an adhesive layer is further provided, the peeling layer thickness is usually 0.1 to 40 μm, and preferably 0.3 to 30 μm.

The image forming layer is formed by kneading the above described image forming layer composition with a solvent to obtain a coating solution, and then coating the coating solution on the support and drying.

The solvent includes water, alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, dichlorobenzene), amide type solvents (dimethylformamide, N-methylpyrrolidone).

The kneaders for an image forming layer composition Suitable examples include two-roll mills, three-roll mills, ball mills, pebble mills, coball mills, Tron mills, sand mills, sand grinders, Sqegvari attritor, high-speed impeller dispersers, high-speed stone mills, high-speed impact mills, dispersers, high-speed mixers, homogenizers, supersonic dispersers, open kneaders, and continuous kneaders.

In order to coat an image forming layer on a support, coating is carried out by a gravure roller coating method, an extrusion method, a wire-bar method and a roller coating method, which are well known.

When multiple image forming layers are provided or other layers than the image forming layer are provided on the image forming layer side, each layer may be coated separately, and the layers may be multilayer coated by wet-on wet coating method.

In carrying out wet-on-wet multilayer coating, a combination of an extrusion coater with a reverse roll, a gravure roll, an air doctor coater, a blade coater, an air knife coater, a squeeze coater, a dip coater, a bar coater, a transfer roll coater, a kiss coater, a cast coater or a spray coater can be used.

When the peeling layer is laminated on the image forming layer, the peeling layer may be adhered to, or only superposed on, the image forming layer to prevent scatter of the image forming layer in an image forming method described later.

When the peeling layer is adhered to the image forming layer and the peeling layer is a self-supporting resin, the layer is provided on the image forming layer by dissolving the resin in a solvent to obtain a coating solution, coating the solution and drying. When the resin film used for a support is used as a peeling layer and the film is a heat sealing polyethylene or polypropylene, the film is provided and laminated on the image forming layer by applying heat and pressure using a hot stamp or heat roller to obtain a peeling layer. When the film does not have a heat sealing property, an adhesion layer is provided on the image forming layer. That is, the adhesion layer forming composition is coated on the image forming layer and dried and then laminating the film on the adhesion layer to obtain a peeling layer or, the adhesion layer forming composition is coated and dried on a resin film or the fusible adhesion layer forming composition is laminated on a resin film by an extrusion-laminating method, and the resulting adhesion layer is superposed on the image forming layer and is subjected to a heat roller or hot stamp heat and pressure treatment to obtain a peeling layer.

The heat treatment by a heat roller is carried out at room temperature to about 180° C., preferably 30° to 160° C., at a pressure of 0.1 to about 20 kg/cm, 0.5 to 10 kg/cm and at a transporting speed of 1 to 200 mm/second, preferably 5 to 100 mm/second. The heat treatment by a hot stamp is carried out at room temperature to about 180° C., preferably 30° to 150° C., at a pressure of 0.1 to 10 kg/cm$^2$, 0.5 to 5 kg/cm$^2$ for 0.1 to about 50 seconds, preferably 0.5 to 20 second.

Before an adhesion layer is provided by extrusion-laminating an olefin resin such as polypropylene on a resin film, the surface of the resin film is preferably subjected to primer treatment.

The primer includes titanium alkoxide, zirconium alkoxide, a metal alkoxide, ethylene-vinyl acetate copolymer, poly vinylidene chloride, an olefin resin such as polybutadiene, a urethane resin, an epoxy resin, a polyester resin, an acryl resin, and a polyethylene imine resin. The primer further includes the above described resin hardened by a hardening agent such as an isocyanate compound, an amine compound or an acid anhydride or by irradiation of an electron ray such as ultraviolet light. The compound described in Chapter 33 to 36, "Sin Ramineto Kako Ichiran" edited by Kakogijutu Kyokai is suitably used as the primer.

A method providing a primer layer includes a solution coating method coating and drying a primer solution or a melt coating method coating a primer layer composition in a melting state. A solvent using in the solution coating includes water, alcohols, cellosolves, aromatic organic solvents, ketones, esters, ethers and chlorinated solvents. The coating is carried out by a gravure roller method, an extrusion method, a wire-bar method and a roller method as conventionally used.

The thickness of the primer layer is usually 0.001 to 2.0 μm, and preferably 0.01 to 1.0 μm.

<Image forming method>

In the invention an image can be obtained by the following two image forming methods using the above described image forming material, and the methods will be explained below.

Image forming method 1

The image forming method 1 comprises the steps of imagewise exposing to a high density energy light the above described image forming material comprising the image forming layer on a support from the support side as shown in FIG. 1(*a*), whereby adhesion force at the exposed portions between the support 1 and the image forming layer 2 is reduced, superposing the image forming layer on an adhesion sheet comprising an adhesive layer 3 on a base 4, facing the adhesive layer as shown in FIG. 1(*b*), and peeling the adhesion sheet from the image forming material whereby the exposed portions 2(*e*) of the image forming layer is transferred to the adhesion sheet to form an image as shown in FIG. 1(*c*).

The reduction of the adhesion force above includes phenomenon that only the adhesion force between the support and the image forming layer is reduced or lost, exposed portions of the image forming layer are heat destroyed or released, or exposed portions of the image forming layer have a crack.

The high density energy light used for imagewise exposing is not limited, so long as it is a light source capable of reducing an adhesion force between the image forming layer and the support. In order to obtain a high resolving power, the light source is preferably an electromagnetic wave capable of making the energy spots smaller, particularly, a UV light having 1 nm to 1 mm wavelength, a visible light or an infrared light. Such a high density energy light includes, for example, a laser light, an emission diode, a xenon flash lamp, a halogen lamp, a carbon arc light, a metal halide lamp, a tungsten lamp, a quarts mercury lamp and a high pressure mercury lamp. The energy applied is optionally adjusted by selecting an exposure distance, an exposure time or an exposure strength according to kinds of image forming materials used.

When an entire exposure is carried out using the high density energy light, the exposure is carried out through a mask material having a negative pattern made of a light shielding material.

When an array light such as an emission diode array is used or exposure using a halogen lamp, a metal halide lamp or a tungsten lamp is controlled using an optical shutter material such as liquid crystal or PLZT, a digital exposure according to an image signal is possible, and direct writing is possible without using the mask material.

However, this method requires additional optical shutter beside the light source. Therefore, the digital exposure is preferably carried out using a laser light.

When the laser light is used, the light can be condensed in the beam form and a latent image is formed using a scanning exposure according to an image. The laser light is easy to condense the exposure spots in small size and therefore, a highly dissolved image can be obtained.

The laser light used in the invention is well known. The laser source includes solid lasers such as a ruby laser, a YAG laser, a glass laser, a gas laser such as a He—Ne laser, a Ar laser, a Kr laser, a $Co_2$ laser, a Co laser, a He—Cd laser, a $N_2$ laser, an eximer laser, an semiconductor laser such as a InGaP laser, a AlGaAs laser, a GaAsP laser, a InGaAs laser, a InAsP laser, $CdSnP_2$ laser or a GaSb laser, a chemical laser, and a dye laser. Of these laser light sources, a laser having a 600 to 1200 nm wavelength is preferable in sensitivity in order to produce effectively abrasion, since a light energy can be effectively converted to a heat energy.

The imagewise exposure is preferably carried out using a high density energy light to reduce or lose only the adhesion force between the support and the image forming layer without destroying the image forming layer, since the exposed portions of the image forming layer can be uniformly removed without release of dust in the exposure. The light exposure is preferably carried out from the support side.

The image forming method 1 comprises the steps of a) imagewise exposing the image forming layer of the image forming material to a high density energy light whereby the adhesion force between the support and the exposed portions of the image forming layer is reduced, b) superposing an adhesive layer of an adhesive sheet on the exposed image forming layer, c) preferably applying pressure or heat pressure to the superposed material, and d) separating the adhesive sheet from the image forming layer to transfer the exposed portions of the image forming layer, in which the adhesion force is reduced, to the adhesive layer.

The adhesion sheet includes an adhesion sheet, a heat sealing sheet and a laminating sheet which are available on the market. When the image forming material contacts the adhesion sheet and pressure or heat-pressure is applied to it, the adhesion sheet can be used without any limitations so long as the pressure or heat-pressure can be applied airtightly. The pressure is applied by means of a pressure roller or a stamper, and the heat-pressure is applied by means of a thermal head, a heat roller or a hot stamp.

When the pressure roller is employed, the pressure is usually 0.1 to 20 kg/cm, and preferably 0.5 to 10 kg/cm and the transport speed is usually 0.1 to 200 mm/sec., and preferably 0.5 to 100 mm/sec. When the stamper is employed, the pressure is usually 0.05 to 10 kg/cm, and preferably 0.5 to 5 kg/cm and the pressure time is usually 0.1 to 50 seconds, and preferably 0.5 to 20 seconds. The thermal head is used under conditions usually applied in the conventional fusible or sublimation transfer process. When the heat roller is employed, the heat temperature is usually 60° to 200° C., and preferably 80° to 180° C., the pressure is usually 0.1 to 20 kg/cm, and preferably 0.5 to 10 kg/cm and the transport speed is usually 0.1 to 200 mm/sec., and preferably 0.5 to 100 mm/sec. When the hot stamper is employed, the heat temperature is usually 60° to 200° C., and preferably 80° to 150° C., the pressure is usually 0.05 to 10 kg/cm, and preferably 0.5 to 5 kg/cm and the pressure time is usually 0.1 to 50 seconds, and preferably 0.5 to 20 seconds.

Various peeling methods can be employed as long as they have no adverse affect on image forming. The peeling method includes a method of peeling the adhesion sheet from the image forming material using a peeling plate or a peeling roller with a fixed peeling angle and a method of manually peeling the adhesion sheet from the image forming material without fixing a peeling angle.

The image forming material having a single image forming layer on a support was described above. When an anchor coat layer is provided between an image forming layer and a support, adhesion force between the support and the anchor coat layer or adhesion force between the image forming layer and the anchor coat layer may be reduced or the anchor coat layer may be partly destroyed.

Image forming method 2

Figure 2:
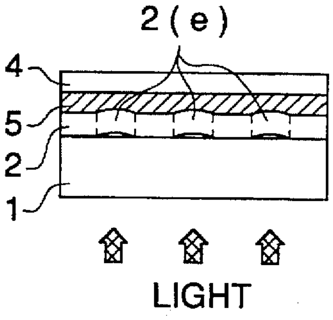
FIGS. 2(*a*), 2(*b*) and 2(*c*) show another one of an image forming process in the invention.
Figure 2:
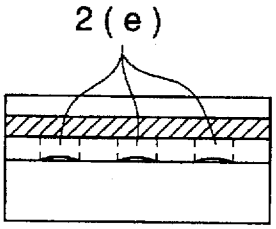
Figure 2:
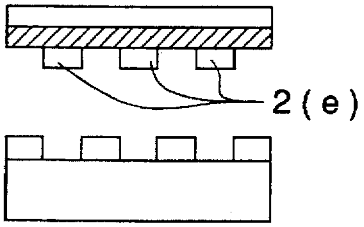

The image forming method 2 comprises the steps of imagewise exposing to a high density energy light an image forming material comprising a peeling layer 5 and a base 4 provided on the image forming layer 2 of the above described image forming material from the support side as shown in FIG. 2(*a*), whereby adhesion force at the exposed portions 2(*e*) between the support and the image forming layer is reduced, applying heat-pressure to the resulting material as shown in FIG. 2(*b*), and peeling the peeling layer from the image forming layer whereby the exposed portions in which the adhesion force is reduced is transferred to the peeling layer side to form an image as shown in FIG. 2(*c*).

The image forming method 1 has a problem that the exposed image forming layer scatters around due to an exposure condition at a high density energy light exposure, but according to the image forming method 2 an image is formed without scattering of the exposed portions, since the peeling layer is provided on the image forming layer.

In this image forming method, the image forming material includes a material in which an image forming layer adheres to a peeling layer and a material in which an image forming layer does not adhere to, but is only in close contact with, a peeling layer.

In the latter case, when the latter material is imagewise exposed to a high density energy light so that a binding force between the image forming layer and the support is reduced, exposed portions of the image forming layer, in which the binding force is reduced, is transferred to a peeling layer by heat or scatter, so that only peeling of the image forming layer produces an image or a part of the exposed portions are transferred to a peeling layer, according to the peeling layer composition. When the image forming layer of an image forming material is prepared not to deform due to heat conduction from the image forming layer or reduction between the image forming layer and support, which is obtained by incorporating fillers in the image forming layer and producing some space between the image forming layer and peeling layer, the image forming material is subjected to a heat pressure treatment (see FIG. 2*b*) after imagewise exposure, and then the peeling layer can be also separated from the image forming layer to transfer the exposed portions to the peeling layer.

The imagewise exposure using a high density energy light is preferably carried out from the support side in this image forming method. The imagewise exposure is preferably carried out to reduce or lose only the adhesion force between the support and the image forming layer without destroying the image forming layer, since the exposed portions of the image forming layer can be uniformly transferred to the peeling layer without release of dust in the exposure.

The imagewise exposure by a high density energy light can be carried out in the same manner as in the image forming method 1, and the optional heat pressure treatment or the method of peeling the peeling layer from the image forming layer can be carried out in the same manner as in the image forming method 1.

EXAMPLES

The invention is hereunder described with examples, but the scope of the invention is by no means limited to them. In the examples, all "parts" are parts by weight, unless otherwise specified.

Example 1

<Image forming material>

The inventive image forming material and comparative image forming material were prepared using a support, an image forming layer, and a peeling layer as shown below. The thus obtained materials are shown in Table 1.

TABLE 1

| Image forming material | Support | Image forming layer | Peeling layer |
|---|---|---|---|
| 1 | 1 | 1 | |
| 2 | 1 | 2 | |
| 3 | 1 | 3 | |
| 4 | 1 | 4 | |
| 5 | 1 | 5 | |

TABLE 1-continued

| Image forming material | Support | Image forming layer | Peeling layer |
|---|---|---|---|
| 6 | 2 | 2 | |
| 7 | 2 | 3 | |
| 8 | 2 | 4 | |
| 9 | 2 | 5 | |
| 10 | 2 | 6 | |
| 11 | 3 | 1 | 1 |
| 12 | 3 | 2 | 1 |
| 13 | 3 | 3 | 1 |
| 14 | 3 | 4 | 1 |
| 15 | 3 | 5 | 1 |
| 16 | 2 | 1 | 2 |
| 17 | 2 | 2 | 2 |
| 18 | 2 | 3 | 2 |
| 19 | 2 | 4 | 2 |
| 20 | 2 | 5 | 2 |
| 21 | 1 | 6 | |
| 22 | 1 | 7 | |
| 23 | 3 | 6 | 1 |
| 24 | 3 | 7 | 1 |
| 25 | 2 | 6 | 2 |
| 26 | 2 | 7 | 2 |

Support (1) T-600E:100 μm transparent polyethylene terephthalate film which have anchor coat on each side produced by Diafoil Hoechst Co., Ltd.

(2) T-100G:100 μm transparent polyethylene terephthalate film which is subjected to anti-static treatment on one side and to corona discharge on an image forming layer side produced by Diafoil Hoechst Co., Ltd.

(3) The corona discharged surface obtained above is coated with a toluene solution containing 0.5 weight % of ethylene-ethylacetate copolymer (Evaflex EV 410 produced by Mitsui Dupont Chemical Co., Ltd.) with a wire-bar coating method and dried to form a 0.05 μm anchor coat layer.

Image forming layer

1) The following composition was kneaded and dispersed with an open kneader to obtain an image forming layer coating solution containing a black dye as a colorant. The resulting coating solution was coated on a support by an extrusion coating method, dried and subjected to calendering at a pressure of 100 kg/cm and curing at 60° C. for 72 hours to give a dry thickness of 1.5 μm, whereby the image forming layer was thermally hardened.

| | |
|---|---|
| Black dye, Oil Color Black HBB (made by Orient Chemical Co., Ltd.) | 10 parts |
| Nitrocellulose, Celnova BTH-½ (made by Asahi Kasei Co., Ltd.) | 20 parts |
| Polyisocyanate (Coronate HX made by Nihon Urethane Kogyo Co., Ltd.) | 8.0 parts |
| Titanium oxide (Idemitsu Titania IT-UD made by Idemitsu Kosan Co., Ltd.) | 10 parts |
| Light heat converting substance (Kayasorb IR-820B made by Nihon Kayaku Co., Ltd.) | 5.0 parts |
| Cyclohexanone | 20 parts |
| Methyl ethyl ketone | 180 parts |

2) The following composition was kneaded and dispersed with an open kneader to obtain an image forming layer coating solution containing graphite as a colorant. The resulting coating solution was coated on a support by an extrusion coating method, dried and subjected to calendering at a pressure of 150 kg/cm and curing at 60° C. for 72 hours to give a dry thickness of 1.5 μm, whereby the image forming layer was thermally hardened.

| | |
|---|---|
| Graphite (Average grain size = 0.03 μm) | 100 parts |
| Polyvinyl butyral, Eslec BL-1 (Tg = 59° C.) (made by Sekisui Kagaku Co., Ltd.) | 20 parts |
| Polyisocyanate (Coronate Hx made by Nihon Urethane Kogyo Co., Ltd.) | 15 parts |
| Stearic acid | 1.0 part |
| Cyclohexanone | 1.0 parts |
| Butyl stearate | 100 part |
| Methyl ethyl ketone | 100 parts |
| Toluene | 100 parts |

3) The following composition was kneaded and dispersed with an open kneader to obtain an image forming layer coating solution. The resulting coating solution was coated on a support by an extrusion coating method, dried and subjected to calendering at a pressure of 2000 kg/cm and curing at 60° C. for 72 hours to give a dry thickness of 1.3 μm, whereby the image forming layer was thermally hardened.

| | |
|---|---|
| Fe—Al ferromagnetic metal powder (Fe:Al ratio in number of atoms: overall average = 100:4, surface layer = 50:50, average major axial length = 0.14 μm, Hc: 1760 ersted, σs: 120 emu/g) BET value = 53 $m^2$/g) | 100 parts |
| Vinyl chloride resin (MR105 made by Nippon Zeon Co., Ltd.: Tg ≦ 85° C.) | 10 parts |
| Polyurethane resin (UR8700 made by Toyobo Co., Ltd.: Tg ≦ 85° C.) | 10 parts |
| α-Alumina (average particle size: 0.15 μm) | 8.0 parts |
| carbon black (average particle size: 0.04 μm) | 0.5 parts |
| Stearic acid | 1.0 part |
| Butyl stearate | 1.0 part |
| Polyisocyanate (Coronate L made by Nihon Urethane Kogyo Co., Ltd.) | 5.0 parts |
| Cyclohexanone | 100 parts |
| Methyl ethyl ketone | 100 parts |
| Toluene | 100 parts |

4) The following composition was headed and dispersed with an open header and added with 0.4 parts of 2,2'-bis(2-chlorophenyl)-4,4',5,5'-tetraphenyl-1,2'-bisimidazole and 0.4 parts of 4,4'-bis(dimethylamino) benzophenone to obtain an image forming layer coating solution. The resulting coating solution was coated on a support by a wire bar coating method, dried and exposed to 60 W/$cm^2$ mercury lamp 10 cm distant for 10 seconds to give a dry thickness of 1.2 μm, whereby the image forming layer was photo-hardened by active energy ray.

| | |
|---|---|
| Fe—Al ferromagnetic metal powder (Fe:Al ratio in number of atoms: overall average = 100:4, surface layer = 50:50, average major axial length = 0.14 μm, Hc: 1760 ersted, σs: 120 emu/g, BET value = 53 $m^2$/g) | 100 parts |
| polymethylmethacrylate (Dianal BR-87 made by Mitsubishi Rayon Co., Ltd.: Tg ≦105° C.) | 10.0 parts |
| Dipentaerythritol hexacrylate (Carayad DPHA made by Nihonkayaku Co., Ltd.) | 8.0 parts |
| Ethyleneoxide (EO) modified tetrabromobisphenol A dimethacrylate (New Frontier BR-42M made by Daiichi Kogyo Seiyaku Co., Ltd.) | 8.0 parts |
| carbon black (average particle size: 0.04 μm) | 0.5 parts |
| Stearic acid | 1.0 part |
| Butyl stearate | 1.0 part |
| Cyclohexanone | 60 parts |
| Methyl ethyl ketone | 60 parts |
| Toluene | 60 parts |

5) The following composition was kneaded and dispersed with an open kneader and added with 0.3 parts of 2,4,6-tris (trichloromethyl)-1,3,5-s-triazine and 0.3 parts of 3-(2-benzothiazoyl) cumarine to obtain an image forming layer coating solution. The resulting coating solution was coated on a support by a wire bar coating method, dried and exposed to 60 W/cm$^2$ mercury lamp 10 cm distant for 20 seconds to give a dry thickness of 1.4 μm, whereby the image forming layer was photo-hardened by active energy ray.

| | |
|---|---|
| Fe—Al ferromagnetic metal powder (Fe:Al ratio in number of atoms: overall average = 100:6, surface layer = 50:90, average major axial length = 0.15 μm, Hc: 1700 Oe, σs: 115 emu/g, BET value = 53 m$^2$/g) | 100 parts |
| Bisphenol A epoxy resin (Epotohto YD-020 made by Toto Kasei Co., Ltd.) | 10 parts |
| Hydrogenated bisphenol A epoxy resin (Epototo SD-3000 made by Toto Kasei Co., Ltd.) | 10 parts |
| Aliphatic epoxy resin (Araldite CY-175 made by Ciba Geigy Co., Ltd.) | 10 parts |
| Carbon black (average particle size: 0.04 μm) | 0.5 parts |
| Stearic acid | 1.0 part |
| Butyl stearate | 1.0 part |
| Cyclohexanone | 60 parts |
| Methyl ethyl ketone | 60 parts |
| Toluene | 60 parts |

6) An image forming layer coating solution was prepared in the same manner as in 2), except that a polyvinyl butyral resin, Eslec BL-1:Tg=59° C. made by Sekisui Kagaku Kogyo Co., Ltd. was used instead of the polyisocyanate. The resulting solution was coated on a support by an extrusion coating method and dried to give an image forming layer having a thickness of 1.5 μm.

7) An image forming layer coating solution was prepared in the same manner as in 3), except that a polyvinyl chloride resin, MR-105:Tg≦85° C. made by Nihon Zeon Co., Ltd. was used instead of the polyisocyanate. The resulting solution was coated on a support by an extrusion coating method and dried to give an image forming layer having a thickness of 1.3 μm.

Peeling layer

1) The following adhesion layer coating solution was coated and dried on a 25 μm transparent polyethylene terephthalate film S-100 (produced by Diafoil Hoechst Co., Ltd.), which is a peeling layer, to obtain an adhesion layer having a thickness of 4.0 μm.

Thereafter, an image forming layer was superposed to face the adhesion layer. The resulting material was subjected to air-tight pressure treatment using a pressure roller (transport speed:30 mm/second, applied pressure:2.0 kg/cm). Thus, an image forming material was obtained which comprises a support and provided thereon, an image forming layer and a peeling layer in that order.

| | |
|---|---|
| Copoly ethylene-vinyl acetate (Evaflex EV410, produced by Mitsui Dupont Chemical Co., Ltd.) | 3.0 parts |
| Silicone fine particles (Tospar produced by Toshiba Silicone Co., Ltd.) | 0.6 parts |
| Toluene | 90 parts |
| Cyclohexanone | 6.4 parts |

2) The hot-melt type adhesion agent (Hirodin 7524, produced by Hirodin Co., Ltd.) was melt-extrusion coated on a 25 μm transparent polyethylene terephthalate film, which is a peeling layer, to obtain an adhesion layer having a thickness of 20 μm.

Figure 3:
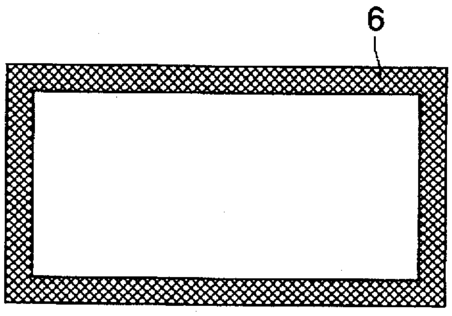
FIG. 3 shows a plane view of an image forming material comprising a support and provided thereon, an image forming layer and a peeling layer in that order, in which the peeling layer was adhered to the image forming layer on the four edges (5), which are not image portions.

Thereafter, an image forming layer was superposed to face the adhesion layer. The superposed material was temporarily adhered on the four edges 6, which are not image portions, as described in FIG. 3, by applying pressure treatment using a hot stamper (temperature:100° C., applied pressure:3.5 kg/cm). Thus, an image forming material was obtained which comprises a support and provided thereon, an image forming layer and a peeling layer in that order.

<Image forming method>

1) The image forming material was imagewise scanning exposed from the support side, focused on the interface between the support and the image forming layer using a semiconductor laser (LT090MD, main wavelength:830 nm, produced by sharp Co., Ltd.). The image forming layer was superposed to face the adhesion layer of adhesion tape Scotch No. 845 book tape produced by 3M Co., Ltd.), and subjected to air-tight pressure treatment using a pressure roller (transport speed:30 mm/second, applied pressure:3.0 kg/cm). The resulting material was fixed on the plate and then, the peeling layer was separated from the image forming layer (at a peeling angle of 90° and a peeling speed of 40 mm/second). Thus, exposed portions, in which a binding force was reduced by the imagewise exposure, were transferred to the adhesion layer to form an image.

Sensitivity, resolving power of the image formed and the density of the exposed portions remained after the transfer were evaluated according to the following criteria.

Sensitivity

The average exposure amount (E, mJ/cm$^2$) on the interface between the support and the image forming layer was measured which is necessary to form a solid image of 0.5 mm×0.5 mm by scanning exposing with a light having a beam diameter of 4 μm, and sensitivity was evaluated according to the following five stages.

⊚ E≦250
○ 250<E≦400
Δ 400<E≦600
X 600<E

Resolving power

The imagewise scanning exposure was carried out to form an image at the average exposure amount whereby sensitivity was evaluated at a scanning pitch of 4 μm with a light having a beam diameter of 4 μm, and resolving power of the image formed was evaluated in terms of lines N per 1 mm, which are resolved, according to the following criteria.

⊚ 125≦N
○ 120≦N<125
Δ 110≦N<120
X N<110

Remaining image density

The imagewise exposure was carried out to form a solid image of 0.5 mm×0.5 mm by scanning exposing with a light having a beam diameter of 4 μm, and an optical density, visual light density (OD:measured transmittance density minus transmittance of the support) at exposed portions was measured using a densitometer (X-rite 310Tr produced by X-rite Co., Ltd.) and evaluated according to the following four stages.

⊚ OD≦0.060
○ 0.060<OD≦0.100
Δ 0.100<OD≦0.250
X 0.250<OD

2) The image forming material was imagewise scanning exposed from the support side, focused on the interface between the support and the image forming layer using a semiconductor laser. The resulting material was fixed on the plate facing the support and then, subjected to heat pressure treatment using a heat roller (transport speed:30 mm/second, temperature:80° C., pressure:2.0 kg/cm). Thereafter, the peeling layer was separated from the image forming layer (at a peeling angle of 80° and a peeling speed of 30 mm/second). Thus, exposed portions, in which a binding force was reduced by a high density energy light exposure, were transferred to the adhesion layer to form an image.

Sensitivity, resolving power of the image formed and remaining rate of the exposed portions remained after the transfer were evaluated in the same manner as 1) above.

The results are shown in Table 2.

TABLE 2

| | Image forming method | Image forming material | Sensitivity | Resolving power | Remaining image density |
|---|---|---|---|---|---|
| Example 1 | 1 | 1 | ◎ | ◎ | ○ |
| Example 2 | 1 | 2 | ○ | ◎ | ○ |
| Example 3 | 1 | 3 | ◎ | ◎ | ◎ |
| Example 4 | 1 | 4 | ◎ | ◎ | ◎ |
| Example 5 | 1 | 5 | ◎ | ◎ | ○ |
| Example 6 | 1 | 6 | ◎ | ◎ | ○ |
| Example 7 | 1 | 7 | ◎ | ◎ | ○ |
| Example 8 | 1 | 8 | ◎ | ◎ | ◎ |
| Example 9 | 1 | 9 | ◎ | ◎ | ◎ |
| Example 10 | 1 | 10 | ◎ | ◎ | ◎ |
| Example 11 | 2 | 11 | ◎ | ◎ | ○ |
| Example 12 | 2 | 12 | ○ | ◎ | ○ |
| Example 13 | 2 | 13 | ◎ | ◎ | ◎ |
| Example 14 | 2 | 14 | ◎ | ◎ | ◎ |
| Example 15 | 2 | 15 | ○ | ◎ | ◎ |
| Example 16 | 2 | 16 | ◎ | ◎ | ○ |
| Example 17 | 2 | 17 | ○ | ◎ | ○ |
| Example 18 | 2 | 18 | ◎ | ◎ | ◎ |
| Example 19 | 2 | 19 | ◎ | ◎ | ◎ |
| Example 20 | 2 | 20 | ○ | ◎ | ○ |
| Comparative Example 1 | 1 | 21 | ○ | x | x |
| Comparative Example 2 | 1 | 22 | ○ | Δ | x |
| Comparative Example 3 | 2 | 23 | Δ | x | x |
| Comparative Example 4 | 2 | 24 | Δ | Δ | x |
| Comparative Example 5 | 2 | 25 | Δ | x | x |
| Comparative Example 6 | 2 | 26 | Δ | Δ | x |

3) The image was formed in the same manner as in 1) above, except that YAG laser DPY521C-NP (output:4000 mW, main wavelength:1064 μm) produced by Adlas Co., Ltd.) was used, and the same evaluation as 1) above was conducted. The results are shown in Table 3.

4) The image was formed in the same manner as in 2) above, except that the YAG laser was used, and the same evaluation as 1) above was conducted. The results are shown in Table 3.

TABLE 3

| | Image forming method | Image forming material | Sensitivity | Resolving power | Remaining image density |
|---|---|---|---|---|---|
| Example 21 | 3 | 2 | ◎ | ◎ | ○ |
| Example 22 | 3 | 3 | ◎ | ◎ | ○ |
| Example 23 | 3 | 4 | ◎ | ◎ | ◎ |
| Example 24 | 3 | 5 | ◎ | ◎ | ◎ |
| Example 25 | 3 | 7 | ◎ | ◎ | ○ |
| Example 26 | 3 | 8 | ◎ | ◎ | ◎ |
| Example 27 | 3 | 9 | ◎ | ◎ | ◎ |
| Example 28 | 3 | 10 | ◎ | ◎ | ◎ |

TABLE 3-continued

| | Image forming method | Image forming material | Sensitivity | Resolving power | Remaining image density |
|---|---|---|---|---|---|
| Example 29 | 4 | 12 | ◎ | ◎ | ○ |
| Example 30 | 4 | 13 | ◎ | ◎ | ◎ |
| Example 31 | 4 | 14 | ◎ | ◎ | ◎ |
| Example 32 | 4 | 15 | ◎ | ◎ | ○ |
| Example 33 | 4 | 17 | ◎ | ◎ | ○ |
| Example 34 | 4 | 18 | ◎ | ◎ | ◎ |
| Example 35 | 4 | 19 | ◎ | ◎ | ◎ |
| Example 36 | 4 | 20 | ◎ | ◎ | ○ |
| Comparative Example 7 | 3 | 21 | ◎ | Δ | x |
| Comparative Example 8 | 3 | 22 | ◎ | Δ | x |
| Comparative Example 9 | 4 | 23 | ○ | Δ | x |
| Comparative Example 10 | 4 | 24 | ◎ | Δ | |
| Comparative Example 11 | 4 | 25 | ○ | Δ | x |
| Comparative Example 12 | 4 | 26 | ◎ | Δ | x |

Example 2

<Image forming material>

The inventive image forming material and comparative image forming material were prepared using a support, an image forming layer, and a peeling layer as shown below. The thus obtained materials are shown in Table 4.

TABLE 4

| Image forming material | Support | Image forming layer | Peeling layer |
|---|---|---|---|
| 1 | 1 | 1 | |
| 2 | 1 | 2 | |
| 3 | 1 | 3 | |
| 4 | 1 | 4 | |
| 5 | 1 | 5 | |
| 6 | 2 | 1 | |
| 7 | 2 | 2 | |
| 8 | 2 | 3 | |
| 9 | 2 | 4 | |
| 10 | 2 | 5 | |
| 11 | 3 | 1 | |
| 12 | 3 | 2 | |
| 13 | 3 | 3 | |
| 14 | 3 | 4 | |
| 15 | 3 | 5 | |
| 16 | 2 | 1 | 1 |
| 17 | 2 | 2 | 1 |
| 18 | 2 | 3 | 1 |
| 19 | 2 | 4 | 1 |
| 20 | 2 | 5 | 1 |
| 21 | 2 | 1 | 2 |
| 22 | 2 | 2 | 2 |
| 23 | 2 | 3 | 2 |
| 24 | 2 | 4 | 2 |
| 25 | 2 | 5 | 2 |
| 26 | 3 | 1 | 2 |
| 27 | 3 | 2 | 2 |
| 28 | 3 | 3 | 2 |
| 29 | 3 | 4 | 2 |
| 30 | 3 | 5 | 2 |

Support (1) Lumiler 11YN47J:11 μm transparent polyethylene terephthalate film subjected to adhesion treatment produced by Toray Co., Ltd.

(2) Lumiler D21J:75 μm transparent polyethylene terephthalate film subjected to adhesion treatment produced by Toray Co., Ltd.

(3) T-100:100 μm transparent polyethylene terephthalate film which is subjected to corona discharge on an image layer side, produced by Diafoil Hoechst Co., Ltd. Image forming layer or Colorant layer Image forming layer 1) The following composition was kneaded and dispersed with an open pressure kneader to obtain an image forming layer coating solution containing magnetic metal powder. The resulting coating solution was coated on a support by an extrusion coating method, subjected to magnetic orientation before drying, dried and subjected to calendering at a pressure of 100 kg/cm to give a dry thickness of 1.2 μm.

| | |
|---|---|
| Fe—Al ferromagnetic metal powder (Fe:Al ratio in number of atoms: overall average = 100:6, surface layer = 50:50, average major axial length = 0.14 μm, Hc: 1760 Oe, σs: 120 emu/g, BET value = 53 $m^2/g$) | 100 parts |
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| α-Alumina (average particle size: 0.15 μm) | 8 parts |
| Stearic acid | 1 part |
| Butyl stearate | 1 part |
| Polyisocyanate (Coronate L made by Nihon Urethane Kogyo Co., Ltd.) | 5 parts |
| Cyclohexanone | 100 parts |
| Methyl ethyl ketone | 100 parts |
| Toluene | 100 parts |

2) The following composition was kneaded and dispersed with an open pressure kneader to obtain an image forming layer coating solution containing magnetic metal powder. The resulting coating solution was coated on a support by an extrusion coating method, subjected to magnetic orientation before drying, dried and subjected to calendering at a pressure of 150 kg/cm to give a dry thickness of 1.0 μm.

| | |
|---|---|
| Fe—Al ferromagnetic metal powder (Fe:Al ratio in number of atoms: overall average = 100:6, surface layer = 50:90, average major axial length = 0.15 μm, Hc: 1700 Oe, σs: 115 emu/g, BET value = 53 $m^2/g$) | 100 parts |
| Potassiumsulfonate-containing vinyl chloride resin (MR110 made by Nippon Zeon Co,., Ltd.) | 10 parts |
| Sodiumsulfonate-containing polyurethane resin (UR8700 made by Toyobo Co., Ltd.) | 10 parts |
| α-Alumina (average particle size: 0.15 μm) | 8 parts |
| Carbon black (average particle size: 0.04 μm) | 0.5 parts |
| Stearic acid | 1 part |
| Butyl stearate | 1 part |
| Polyisocyanate (Coronate L made by Nihon Urethane Kogyo Co., Ltd.) | 5 parts |
| Cyclohexanone | 100 parts |
| Methyl ethyl ketone | 100 parts |
| Toluene | 100 parts |

3) The image forming layer was formed in the same manner as in 3) above, except that Co coating $FeO_x$ powder (Hc:750 Oe, BET value=45 $m^2/g$, X=1.417) was used instead of the above Fe—Al ferromagnetic metal powder.

4) The following composition was kneaded and dispersed with a sand mill to obtain an image forming layer coating solution containing magnetic metal powder. The resulting coating solution was coated on a support according to an extrusion method, subjected to magnetic orientation before drying, dried and subjected to calendering at a pressure of 200 kg/cm to give an image forming layer of a dry thickness of 1.0 μm.

| | |
|---|---|
| Co—Ti—Nb substituted barium ferrite powder (Hc: 1000 Oe) | 100 parts |
| Sodiumsulfonate-containing polyurethane resin (UR8700 made by Toyobo Co., Ltd.) | 8 parts |
| α-Alumina (average particle size: 0.15 μm) | 5 parts |
| Carbon black (average particle size: 0.02 μm) | 1 part |
| Stearic acid | 3 parts |
| Butyl stearate | 2 parts |
| Polyisocyanate (Coronate L made by Nihon Urethane Kogyo Co., Ltd.) | 3 parts |
| Cyclohexanone | 120 parts |
| Toluene | 60 parts |

5) The image forming layer was formed in the same manner as in 4) above, except that Co—Ti barium ferrite (Hc:1100 Oe, BET value=46 $m^2/g$, aspect ratio:4) was used instead of the Co—Ti—Nb substituted barium ferrite powder. Peeling layer 1) The following adhesion layer coating solution was coated and dried on a 25 μm transparent polyethylene terephthalate film S (produced by Diafoil Hoechst Co., Ltd.), which is a peeling layer, to obtain an adhesion layer having a thickness of 5.0 μm.

Thereafter, an image forming layer was superposed to face the adhesion layer. The resulting material was subjected to air-tight pressure treatment using a pressure roller (transport speed:30 mm/second, applied pressure:2.0 kg/cm). Thus, an image forming material was obtained which comprises a support and provided thereon, an image forming layer and a peeling layer in that order.

| | |
|---|---|
| Copoly ethylene-vinyl acetate (Evaflex EV310, produced by Mitsui Dupont Chemical Co., Ltd.) | 5 parts |
| Toluene | 90 parts |
| Cyclohexanone | 5 parts |

2) The hot-melt type adhesion agent (Hirodin 7524, produced by Hirodin Co., Ltd.) was melt-extrusion coated on a 25 μm transparent polyethylene terephthalate film, which is a peeling layer, to obtain an adhesion layer having a thickness of 20 μm.

Thereafter, an image forming layer was superposed to face the adhesion layer. The image forming layer and the adhesion layer were tightly adhered each other by applying pressure treatment using a heat roller (temperature:60° C., transport speed:40 mm/second, applied pressure:1.5 kg/cm). Thus, an image forming material was obtained which comprises a support and provided thereon, an image forming layer and a peeling layer in that order.

<Image forming method>

1) The image forming material was imagewise scanning exposed from the support side, focused on the interface between the support and the image forming layer using a semiconductor laser (LT090MD, main wavelength:830 nm, produced by sharp Co., Ltd.). The image forming layer was superposed to face the adhesion layer of adhesion tape Scotch No. 845 book tape produced by 3M Co., Ltd.), and subjected to air-tight pressure treatment using a pressure roller (transport speed:30 mm/second, applied pressure:3.0 kg/cm). The resulting material was fixed on the plate and then, the peeling layer was separated from the image forming layer (at a peeling angle of 90° and a peeling speed of 40 mm/second). Thus, exposed portions, in which a binding force was reduced by the imagewise exposure, were transferred to the adhesion layer to form an image.

Sensitivity and resolving power of the image formed were evaluated in the same manner as in Example 1. The results are shown in Table 5.

2) The image forming material was imagewise scanning exposed from the support side, focused on the interface between the support and the image forming layer using a semiconductor laser. The resulting material was fixed on the plate facing the support and the peeling layer was separated from the image forming layer (at a peeling angle of 80° and a peeling speed of 30 mm/second). Thus, exposed portions, in which a adhesion force was reduced by imagewise exposure, were transferred to the adhesion layer to form an image.

Sensitivity and resolving power of the image formed were evaluated in the same manner as in Example 1. The results are shown in Table 5.

TABLE 5

| | Image forming method | Image forming material | Sensitivity | Resolving power |
|---|---|---|---|---|
| Example 1 | 1 | 1 | ◎ | ○ |
| Example 2 | 1 | 2 | ◎ | ◎ |
| Example 3 | 1 | 3 | ◎ | ○ |
| Example 4 | 1 | 4 | ◎ | ○ |
| Example 5 | 1 | 5 | ◎ | ○ |
| Example 6 | 1 | 6 | ◎ | ◎ |
| Example 7 | 1 | 7 | ◎ | ◎ |
| Example 8 | 1 | 8 | ◎ | ◎ |
| Example 9 | 1 | 9 | ◎ | ◎ |
| Example 10 | 1 | 10 | ◎ | ◎ |
| Example 11 | 1 | 11 | ◎ | ◎ |
| Example 12 | 1 | 12 | ◎ | ◎ |
| Example 13 | 1 | 13 | ◎ | ◎ |
| Example 14 | 1 | 14 | ◎ | ◎ |
| Example 15 | 1 | 15 | ◎ | ◎ |
| Example 16 | 2 | 16 | ◎ | ◎ |
| Example 17 | 2 | 17 | ◎ | ◎ |
| Example 18 | 2 | 18 | ◎ | ◎ |
| Example 19 | 2 | 19 | ◎ | ◎ |
| Example 20 | 2 | 20 | ◎ | ◎ |
| Example 21 | 2 | 21 | ◎ | ◎ |
| Example 22 | 2 | 22 | ◎ | ◎ |
| Example 23 | 2 | 23 | ◎ | ◎ |
| Example 24 | 2 | 24 | ○ | ◎ |
| Example 25 | 2 | 25 | ○ | ◎ |
| Example 26 | 2 | 26 | ◎ | ◎ |
| Example 27 | 2 | 27 | ◎ | ◎ |
| Example 28 | 2 | 28 | ◎ | ◎ |
| Example 29 | 2 | 29 | ○ | ◎ |
| Example 30 | 2 | 30 | ○ | ◎ |

3) The image was formed in the same manner as in 1) above, except that YAG laser DPY521C-NP (output:4000 mW, main wavelength:1064 μm) produced by Adlas Co., Ltd.) was used, and sensitivity and resolving power of the image formed were evaluated in the same manner as in Example 1. The results are shown in Table 6.

4) The image was formed in the same manner as in 2) above, except that the YAG laser was used, and sensitivity and resolving power of the image formed were evaluated in the same manner as in Example 1. The results are shown in Table 6.

TABLE 6

| | Image forming method | Image forming material | Sensitivity | Resolving power |
|---|---|---|---|---|
| Example 31 | 3 | 1 | ◎ | ◎ |
| Example 32 | 3 | 2 | ◎ | ◎ |
| Example 33 | 3 | 3 | ◎ | ◎ |
| Example 34 | 3 | 4 | ◎ | ◎ |
| Example 35 | 3 | 5 | ◎ | ◎ |
| Example 36 | 3 | 6 | ◎ | ◎ |
| Example 37 | 3 | 7 | ◎ | ◎ |
| Example 38 | 3 | 8 | ◎ | ◎ |
| Example 39 | 3 | 9 | ◎ | ◎ |
| Example 40 | 3 | 10 | ◎ | ◎ |
| Example 41 | 3 | 11 | ◎ | ◎ |
| Example 42 | 3 | 12 | ◎ | ◎ |
| Example 43 | 3 | 13 | ◎ | ◎ |
| Example 44 | 3 | 14 | ◎ | ◎ |
| Example 45 | 3 | 15 | ◎ | ◎ |
| Example 46 | 4 | 16 | ◎ | ◎ |
| Example 47 | 4 | 17 | ◎ | ◎ |
| Example 48 | 4 | 18 | ◎ | ◎ |
| Example 49 | 4 | 19 | ◎ | ◎ |
| Example 50 | 4 | 20 | ◎ | ◎ |
| Example 51 | 4 | 21 | ◎ | ◎ |
| Example 52 | 4 | 22 | ◎ | ◎ |
| Example 53 | 4 | 23 | ◎ | ◎ |
| Example 54 | 4 | 24 | ◎ | ◎ |
| Example 55 | 4 | 25 | ◎ | ◎ |
| Example 56 | 4 | 26 | ◎ | ◎ |
| Example 57 | 4 | 27 | ◎ | ◎ |
| Example 58 | 4 | 28 | ◎ | ◎ |
| Example 59 | 4 | 29 | ◎ | ◎ |
| Example 60 | 4 | 30 | ◎ | ◎ |

Example 3

The constitution of the peeling layer used in the invention was varied and evaluated for staining.

<Image forming material>

The inventive or comparative image forming material was prepared using a support, an image forming layer and a peeling layer described below.

Support

Twentyfive μm transparent polyethylene terephthalate film (T-100, produced by Diafoil Hoechst Co., Ltd.) which is corona discharged on the image forming layer Image forming layer Image forming layer 1

The following composition was kneaded and dispersed with an open kneader to obtain an image forming layer coating solution containing metal containing powder. The resulting coating solution was extrusion coated on a support, subjected to magnetic orientation before drying, dried and subjected to calendering to give a dry thickness of 1.2 μm.

| | |
|---|---|
| Fe—Al ferromagnetic metal powder (colorant and metal containing powder; Fe:Al ratio in number of atoms: overall average 100:4, surface layer = 50:50, average major axial length = 0.14 μm) | 100 parts |
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| α-Alumina (average particle size: 0.15 μm) | 8 parts |
| Stearic acid | 1 part |
| Butyl stearate | 1 part |
| Polyisocyanate (Coronate L made by Nihon Urethane Kogyo Co., Ltd.) | 5 parts |
| Cyclohexanone | 100 parts |
| Methyl ethyl ketone | 100 parts |
| Toluene | 100 parts |

Peeling layers 1 through 13

The following fine particles which have different average particle size were added in various amounts to a binder solution containing 10% polyvinyl alcohol resin (Gosenol GL05 produced by Hihon Goseikagaku Co., Ltd.) and subjected to a ultrasonic dispersion. The resulting solution was coated by a wire bar on a 100 μm transparent polyethylene terephthalate (T-100 produced by Diafoil Hoechst Co., Ltd.) film which was corona discharged and dried to obtain a peeling layer as shown in Table 7.

The number in an area of 1 $cm^2$ of fine particles which protrude 1 μm or more from the surface of the peeling layer was counted using a microscope. The number was divided by 100 to obtain a protruding fine particle number per 1 $mm^2$.

Fine particles

Monodispersed PMMA particles MX-300 (average particle size: 3.0 μm, produced by Soken Kagaku Co., Ltd.)

Monodispersed PMMA particles MX-1500 (average particle size: 15.0.0 μm, produced by Soken Kagaku Co., Ltd.)

Silicone resin fine particles Tospar 108 (average particle size: 0.8 μm, produced by Toshiba Silicone Co., Ltd.)

Silicone resin fine particles Tospar 145 (average particle size: 4.5 μm, produced by Toshiba Silicone Co., Ltd.)

Silicone resin fine particles Tospar 3120 (average particle size: 12.0 μm, produced by Toshiba Silicone Co., Ltd.)

<Image forming method>

The image forming material was imagewise exposed from the support side, focused on the image forming layer using a semiconductor laser (LT090MD, main wavelength:830 nm, produced by sharp Co., Ltd.). The image forming layer, in which a binding force at exposed portions was reduced by the laser exposure, was separated from the peeling layer to form an image.

The transparent density of the exposed portions, staining remain of the exposed portions, was evaluated according to the following criteria.

Transparent density

The visual light transparent density D at exposed portions of the image forming material was measured using a densitometer (X-rite 310Tr produced by X-rite Co., Ltd.) according to the following four stages.

A D≦0.030 (excellent)

B 0.040≦D≦0.05 (Slight image forming layer remained is observed by a microscope, and no problem.)

C 0.06≦D≦0.09 (Image forming layer remained after transfer is observed by a roupe.)

D 0.10≦D (Image forming layer after transfer is observed.)

TABLE 7

| Peeling layer | Thickness μm | Average particle size μm | Protruding number number/$mm^2$ | Transparent density | Material name | Maker | Fine particles material |
|---|---|---|---|---|---|---|---|
| 1 | 6.0 | 15.0 | 5 | D | MX-1500 | Soken Kagaku | Acryl resin |
| 2 | 6.0 | 15.0 | 8 | D | MX-1500 | Soken Kagaku | Acryl resin |
| 3 | 6.0 | 15.0 | 10 | B | MX-1500 | Soken Kagaku | Acryl resin |
| 4 | 6.0 | 15.0 | 20 | B | MX-1500 | Soken Kagaku | Acryl resin |
| 5 | 6.0 | 15.0 | 50 | A | MX-1500 | Soken Kagaku | Acryl resin |
| 6 | 20.0 | 15.0 | 50 | B | MX-1500 | Soken Kagaku | Acryl resin |
| 7 | 5.0 | 4.5 | 100 | A | Tospar 145 | Toshiba Silicone | Silicone resin |
| 8 | 5.0 | 4.5 | 9 | D | Tospar 145 | Toshiba Silicone | Silicone resin |
| 9 | 5.0 | — | 0 | D | None | | |
| 10 | 0.5 | 0.8 | 0 | D | Tospar 108 | Toshiba Silicone | Silicone resin |
| 11 | 0.5 | 0.8 | 50 | C | Tospar 108 | Toshiba Silicone | Silicone resin |
| 12 | 5.0 | 3.0 | 20 | B | MX-300 | Soken Kagaku | Acryl resin |
| 13 | 5.0 | 12.0 | 200 | A | Tospar 3120 | Toshiba Silicone | Silicone resin |

As is apparent from Table 7, the peeling layer used in the invention gives an excellent transparent density (OD a measure of staining).

Example 4

Peeling layers 20 through 25

The transparent polyethylene terephthalate film used in Example 3 is surface roughened according to sand blast treatment on one side of the support, and the surface roughness of the sand blasted surface was varied to obtain a peeling layer. The image forming layer of Example 3 was provided on the above support in the same manner as in Example 1, and the resulting image forming material was processed in the same manner as in Example 3 to form an image, and evaluated in the same manner as in Example 3. The results are shown in Table 8.

The peeling layer 20 is not surface roughened.

The surface roughness was measured using a surface roughness meter Surfcorder SEF-30D produced by Kosaka Co., Ltd. Thus, a center line average surface roughness was measured at a 20000 longitudinal direction magnification, a 0.08 mm cut-off, a 2.5 mm of standard length and at a feed speed of 0.1 mm/second.

Resolving power

The imagewise scanning exposure was carried out to form an image at an average surface exposure amount at a scanning pitch of 6 μm with a light having a beam diameter of 6 μm, and resolving power of the image formed was evaluated in terms of line number N per 1 mm, which are resolved, according to the following criteria.

A 80<N

B 40≦N≦80

C 20≦N<40
D N<20

TABLE 8

| Peeling layer | $R_a$ | Transparent density | Resolving Power |
|---|---|---|---|
| 20 | 0.016 | D | C |
| 21 | 0.04 | B | A |
| 22 | 0.10 | B | A |
| 23 | 0.50 | A | A |
| 24 | 1.00 | B | B |
| 25 | 2.00 | D | D |

As is apparent from Table 8, the peeling layer used in the invention gives more excellent transparent density (OD measure of staining) and resolving powder in the preferable $R_a$.

Example 5

The image forming layer of Example 3 was provided on a transparent 100 μm polyethylene terephthalate film T-100 (produced by Diafoil Hoechst Co., Ltd.) which was corona discharged on the image forming layer side in the same manner as in example 1 to form a 1.1 μm thick image forming layer.

A solution, in which 10% of polyurethane resin Nippolan 3116 (produced by Nihon Polyurethane Kogyo Co., Ltd) was dissolved in a mixture solvent of methylethyl ketone/toluene/cyclohexanone (=4/4/2), was coated on a white 38 μm polyethylene terephthalate film W-410 (produced by Diafoil Hoechst Co., Ltd.) and dried to form peeling layers having adhesion layers of different surface roughness.

Thereafter, the image forming layer was superposed on the adhesion layer to face the adhesion layer. The image forming layer and the adhesion layer were tightly adhered to each other by applying pressure treatment using a heat-pressure roller (transport speed:20 mm/second, applied pressure:2.0 kg/cm, temperature:80° C.,) to obtain an image forming material. Using the resulting image forming material, an image was formed and evaluated in the same manner as in Example 3. The results are shown in Table 9.

TABLE 9

| Peeling layer | Peeling layer thickness (μm) | $R_a$, (μm) | Transparent density | Resolving power |
|---|---|---|---|---|
| 26 | 0.2 | 0.15 | B | B |
| 27 | 0.5 | 0.12 | A | A |
| 28 | 0.8 | 0.08 | A | A |
| 29 | 1.0 | 0.04 | B | B |
| 30 | 1.5 | 0.01 | D | D |

What is claimed is:

1. An image forming material comprising a support and provided thereon, an image forming layer containing a colorant, the image forming layer having been hardened and subjected to calendar treatment, wherein an image is formed by removing exposed portions of the image forming layer of the image forming material.

2. The image forming material of claim 1, wherein the image forming layer is obtained by coating a coating solution for the image forming layer on a support and then hardening the coated solution.

3. The image forming material of claim 1, wherein the image forming layer is obtained by laminating a hardened image forming layer on a support.

4. The image forming material of claim 1, wherein the image forming layer is formed by heat hardening an image forming layer containing a heat-hardenable resin.

5. The image forming material of claim 1, wherein the image forming layer is formed by hardening with an active energy ray an image forming layer containing a resin capable of being hardened with the active energy ray.

6. The image forming material of claim 1, wherein the colorant is a light heat converting agent or a visible light absorbing compound having a spectral absorption wavelength of 300 to 800 nm.

7. The image forming material of claim 6, wherein the visible light absorbing compound is a metal atom-containing inorganic compound.

8. The image forming material of claim 1, wherein a peeling layer is provided on the image forming layer.

9. The image forming material of claim 8, wherein the peeling layer comprises fine particles protruding from the peeling layer surface, and the number of fine particles having a protruding height of 1 to 20 μm is 10 or more per $mm^2$ of the peeling layer.

10. The image forming material of claim 8, wherein the surface roughness $R_a$ of the peeling layer surface facing the image forming layer is 0.04 to 1.0 μm, wherein $R_a$ is measured according to JIS B0601.

* * * * *